United States Patent
Kong et al.

(10) Patent No.: US 8,545,998 B2
(45) Date of Patent: Oct. 1, 2013

(54) ELECTROLESS DEPOSITION OF PLATINUM ON COPPER

(75) Inventors: Bob Kong, Newark, CA (US); Igor Ivanov, Danville, CA (US); Zhi-Wen Sun, San Jose, CA (US); Jinhong Tong, Santa Clara, CA (US)

(73) Assignee: Intermolecular, Inc., San Jose, CA (US)

( * ) Notice: Subject to any disclaimer, the term of this patent is extended or adjusted under 35 U.S.C. 154(b) by 0 days.

(21) Appl. No.: 13/333,509

(22) Filed: Dec. 21, 2011

(65) Prior Publication Data

US 2012/0091590 A1  Apr. 19, 2012

Related U.S. Application Data

(62) Division of application No. 12/200,841, filed on Aug. 28, 2008.

(51) Int. Cl.
| | |
|---|---|
| *B32B 9/00* | (2006.01) |
| *B32B 19/00* | (2006.01) |
| *H01L 23/48* | (2006.01) |
| *H01L 23/52* | (2006.01) |
| *H01L 29/40* | (2006.01) |

(52) U.S. Cl.
USPC .......... 428/699; 106/1.24; 257/532; 257/751; 257/752; 257/762; 257/769; 428/209; 428/615; 428/670; 428/674; 428/689

(58) Field of Classification Search
USPC .............. 106/1.24; 257/532, 751, 752, 762, 257/769; 428/209, 615, 670, 674, 689, 699
See application file for complete search history.

(56) References Cited

U.S. PATENT DOCUMENTS

| | | | |
|---|---|---|---|
| 6,214,728 B1 * | 4/2001 | Chan et al. ................ | 438/678 |
| 6,641,899 B1 * | 11/2003 | Colburn et al. ............ | 428/209 |
| 7,390,739 B2 * | 6/2008 | Lazovsky et al. .......... | 438/653 |
| 7,749,881 B2 * | 7/2010 | Lazovsky et al. .......... | 438/597 |
| 2005/0051831 A1 * | 3/2005 | Kajimoto et al. .......... | 257/314 |
| 2005/0087871 A1 * | 4/2005 | Abe ............................ | 257/751 |
| 2005/0127432 A1 * | 6/2005 | Yu et al. ..................... | 257/327 |
| 2006/0237799 A1 * | 10/2006 | Lu et al. ..................... | 257/382 |
| 2007/0166989 A1 * | 7/2007 | Fresco et al. ............... | 438/597 |
| 2007/0205510 A1 * | 9/2007 | Lavoie et al. ............... | 257/734 |

* cited by examiner

*Primary Examiner* — Jonathan Langman

(57) ABSTRACT

Embodiments of the current invention describe a method of plating platinum selectively on a copper film using a self-initiated electroless process. In particular, platinum films are plated onto very thin copper films having a thickness of less than 300 angstroms. The electroless plating solution and the resulting structure are also described. This process has applications in the semiconductor processing of logic devices, memory devices, and photovoltaic devices.

15 Claims, 3 Drawing Sheets

ELECTROLESS DEPOSITION OF PLATINUM ON COPPER

PRIORITY CLAIM TO RELATED APPLICATIONS

This application is a Divisional Application of U.S. patent application Ser. No. 12/200,841 entitled "Electroless Deposition of Platinum on Copper" filed on Aug. 28, 2008 which is incorporated herein by reference.

FIELD OF THE INVENTION

The present invention relates generally to semiconductor processing. More specifically, a film formed by the electroless deposition of Platinum on copper and a method of forming such a film is described.

BACKGROUND OF THE INVENTION

The electroless plating of metals onto copper is becoming increasingly valuable to the semiconductor industry, for logic, memory, and photovoltaic devices. As the scale of the copper features are scaled down, the use of electroless deposition has become valuable because of its conformal nature and its ability to deposit thin films selectively on complex and small scale features.

For logic devices, metals such as cobalt and its many alloys have been used to form capping layers over copper interconnect lines to prevent electromigration of the copper lines. But, cobalt or alloys of cobalt tend to oxidize and may increase the effective resistance of the copper lines. Metals that will not oxidize, such as noble metals, can be used in place of cobalt but are difficult to plate onto the increasingly small copper features. Either galvanic initiation by aluminum contact or thick copper (greater than 300 angstroms thickness) has to be used to obtain platinum film deposition. Thick copper films have been necessary for the plating of platinum onto copper because the activation step attacks and degrades the copper.

Electroless deposition may also have valuable applications for memory devices. This is because the blanket deposition of a platinum film on copper by physical vapor deposition (PVD) requires multiple steps to etch the platinum from the regions where it is not desired (e.g. over the dielectric layer.) Plasma etching of platinum is very difficult to do in production because of poor pattern definition due to the primarily physical sputtering and high tool maintenance needed after heavy platinum deposition on the chamber walls. The deposition of platinum on the deposition chamber walls requires constant cleaning to maintain process stability.

BRIEF DESCRIPTION OF THE DRAWINGS

Various embodiments of the invention are disclosed in the following detailed description and the accompanying drawings.

DETAILED DESCRIPTION

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

Embodiments of the current invention describe a method of plating platinum selectively on a copper film using a self-initiated electroless process. In particular, platinum films are plated onto very thin copper films having a thickness of less than 300 angstroms. The electroless plating solution and the resulting structure are also described. This process has applications in the semiconductor processing of logic devices, memory devices, and photovoltaic devices.

Figure 1:
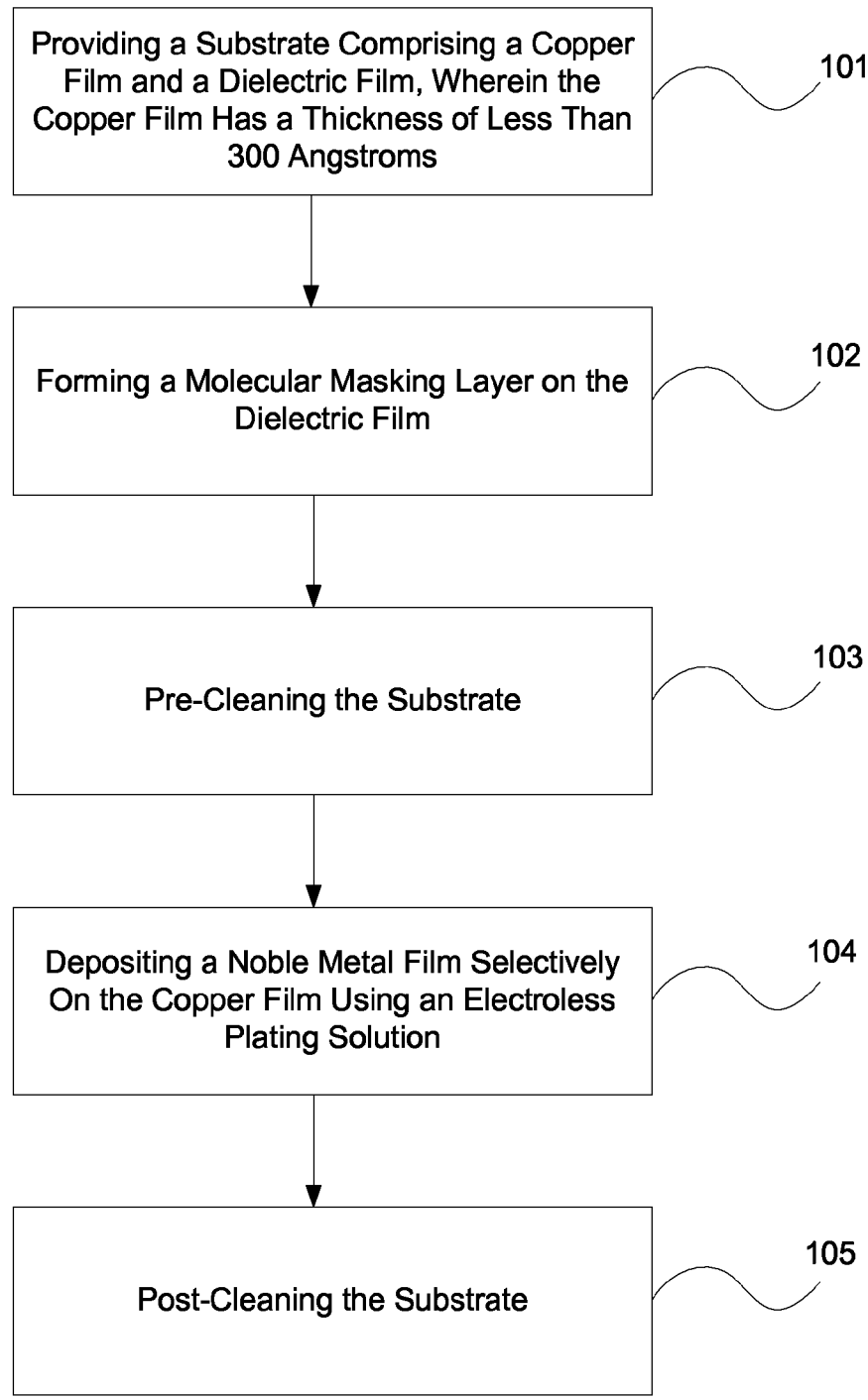
FIG. 1 is a flowchart describing a process for the electroless deposition of platinum on to copper.
Figure 2A:
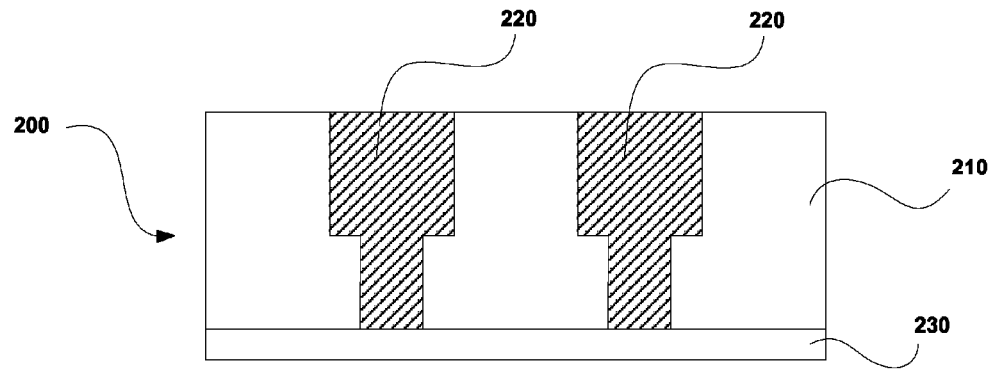
FIGS. 2A-2C illustrates a cross-sectional view of an integrated circuit according to an embodiment of the current invention.
Figure 2B:
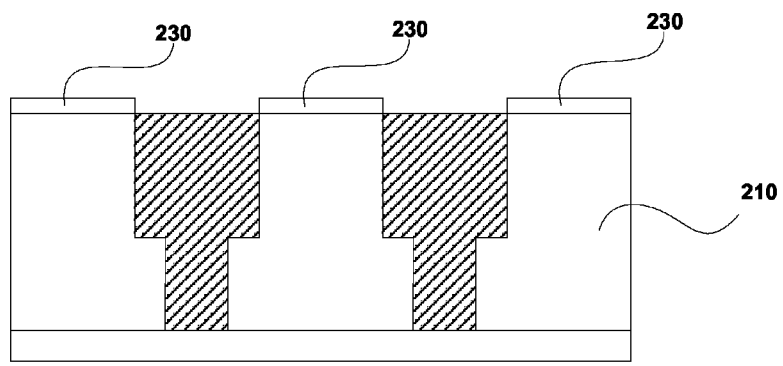
Figure 2C:
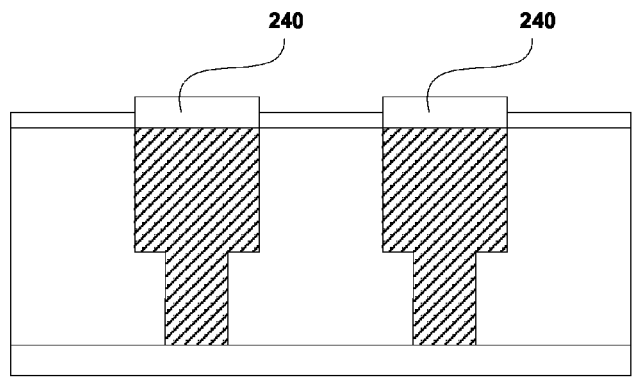

FIG. 1 illustrates a block diagram showing one embodiment of the current invention. At block 101, a substrate comprising a copper film and a dielectric film is provided. The substrate may be a semiconductor substrate such as silicon, silicon-on-insulator, gallium arsenide or it may be a substrate such as glass on which microdevices are formed. The copper films are very thin, having a thickness of less than 300 angstroms. The copper films may be part of the interconnect lines or vias in a logic device as illustrated in FIGS. 2A-2C, or the copper films may alternatively be part of a memory device, such as the bottom electrode illustrated in FIGS. 3A and 3B. The flowchart of FIG. 1 applies to any substrate having a copper film and a dielectric film, but for purposes of example, the flowchart will be described in relation to FIGS. 2A-2C. In FIG. 2A, the substrate 200 may be an integrated circuit having a dual damascene structure typical of copper wiring with low-k dielectric materials. The base 230 may be any semiconductor material such as silicon, silicon-on-insulator, or gallium arsenide. The dielectric region 210 may be any dielectric used in the semiconductor industry, such as a silicon dioxide-based material ($SiO_2$), SiCN, SiCOH, SiN, SiC, $SiO_2$, methyl-silsesquioxane (MSQ), SILK dielectric by Dow Chemical, parylene, organic low-k polymers, and other similar materials. Additionally, dielectric regions may include a hard mask layer (not shown) at the surface of the low-k dielectric regions, which is often formed of a silicon-based material like $SiC_x$, $SiN_x$, $SiC_xN_y$, etc., where the variables x and y represent values as appropriate to desired compositions. The integrated circuit 200 also has copper regions 220 having a thickness of less than 300 angstroms. In this embodiment illustrated in FIGS. 2A-2C, the copper regions are interconnect lines and vias formed by a dual damascene process.

At block 102 of FIG. 1, surface modifier 240 may optionally be formed on the dielectric regions 210 of the substrate. The surface modifier 240 creates a protective layer over the dielectric regions 210 that will protect the dielectric regions 210 during subsequent processing. In some embodiments the surface modifier 240 can be a single monolayer of material. The surface modifier 240 also increases the selectivity of any subsequent aqueous processing, such as an electroless process, to the regions of the substrate that are not covered by the surface modifier 240. In this instance, the surface modifier 230 would increase the selectivity of the platinum electroless plating solution to the copper regions 220. The surface modifier can be, for example, a layer formed from any class of materials known to form with controlled film thickness, such as, for instance, multi-layer polyelectrolytes. The surface modifier can also be, for example, a layer formed on the surface of the dielectric region through the catalytic growth of inorganic or organic materials, such as polymer brushes. The surface modifier can also be, for example, an ionic or electrochemically-enhanced self-assembled multilayer or monolayer. In particular, silane-based materials can be used to form the masking layer in an embodiment of the invention. In some embodiments, the surface modifier 240 may be formed of an amphiphilic compound such as a polyvinyl alcohol (PVA), a PVA copolymer, an amphiphilic macromolecule, a modified starch compound, a protein compound, a diblock copolymer, a triblock copolymer, or a dendrimer. The PVA polymers may include: co-ethylene, co-cation, co-siloxane, co-anion (88% hydrolyzed), and co-anion (80% hydrolyzed). As utilized herein, amphiphilic is a term describing a chemical compound possessing both hydrophilic and hydrophobic properties. The amphiphilic surface modifiers can also be tailored to have certain chemical properties and size for different applications. For example, because the surface modifier is amphiphilic, the solution may be formulated to adjust the wetting angle of a surface. In other embodiments, the amphiphilic surface modifier may be selected to be relatively large molecules (macro-molecules) to block pores and to prevent or minimize diffusion of any wet process compounds into blocked pores. In yet another embodiment, amphiphilic compounds may be utilized to protect porous low-k dielectric materials from subsequent processes. Additionally, after forming the surface modifier 240 on the substrate, the surface modifier 240 may be cross-linked to provide a more stable surface modifier 240 and may be desirable in some applications where harsh electroless aqueous processes (e.g., high temperature processes or high pH conditions) are anticipated. Cross-linking processes may be performed by chemical cure or by non-chemical cure.

The substrate 200 may be pre-cleaned at block 103 of FIG. 1 in preparation for a subsequent process. The pre-cleaning can remove any surface contaminants from the substrate and remove any copper oxide film from the copper regions 220 prior to the platinum electroless deposition. To accomplish this, the pre-cleaning solution can be acidic, alkaline, or sequential acidic and then alkaline cleaning solutions. Acidic pre-cleaning solutions can be mineral acids or organic acids. Examples of mineral acids include HCl and $H_2SO_4$, and examples of organic acids include polycarboxylic acids such as citric acid, tartaric acid, and oxalic acid. The alkaline pre-cleaning solutions may be amine containing solutions such as ethanolamine, diethanolamine, and triethanolamine. Anti-oxidants such as ascorbic acid may be added into the alkaline pre-cleaning solution to minimize attack of the copper by the alkaline pre-cleaning solution. Ascorbic acid can be added to a pre-cleaning solution of any pH because its anti-oxidation effects are independent of pH. In one embodiment, the pre-cleaning may be a sequential application of acidic and alkaline pre-cleaning solutions. In one particular embodiment, the pre-clean may be an alkaline pre-cleaning solution such as CoppeReady™ CP-72 by Air Products and Chemicals, Inc. of Allentown, Pa., diluted 1:10 V/V in deionized water at room temperature for approximately 0.5-2.0 minutes followed by a deionized (DI) water rinse, also at room temperature, for approximately 0.5-2.0 minutes. After rinsing with DI water, an acidic pre-cleaning solution formed of 2% citric acid in deionized water is applied to the substrate 200 for approximately 1 minute. The acidic pre-cleaning solution is then rinsed with room temperature DI water for approximately 10-60 seconds.

In some embodiments, it may be desirable to pre-clean a substrate to remove any excess, unattached surface modifier. In some embodiments, in order to remove only excess surface modifier, such a pre-clean step may be accomplished by utilizing an aqueous solution at a temperature lower or higher than what is required to dissolve or otherwise release the surface modifier from the surface. In one such embodiment, pre-cleaning the substrate may include a washing step that utilizes a dilute oxalic acid solution that includes CP72B for approximately 30 seconds followed by a rinsing step that utilizes an approximately 2% citric acid solution for approximately 30 seconds. In another embodiment, the pre-clean may be a first clean of PB-72 (1:10) at approximately room temperature applied for approximately 0.5-2.0 minutes followed by a deionized water rinse at room temperature for 10-60 seconds. The pre-clean then includes a second clean of 2% citric acid at room temperature for 0.5-2.0 minutes.

At block 104 of FIG. 1, a platinum film 250 is selectively deposited on the copper regions 220 using an electroless plating solution. The electroless plating solution is formulated to deposit platinum onto copper, and in particular, to deposit platinum electrolessly onto very thin copper films having a thickness of less than 300 angstroms. The electroless plating solution is also formulated to be stable at operating temperature for a time period longer than the deposition time. The electroless plating solution described in embodiments of this invention is self-initiating, meaning that activation of the copper film regions by a pre-treatment may not be necessary to initiate the electroless plating. Because the platinum plating solution will self-initiate the deposition of platinum on the copper film, and not on other types of materials such as dielectric materials, the plating of the platinum layer is selective to the copper film regions. Also, the self-initiating film is good for very thin films of copper because an activation step often degrades the copper, making it even thinner. In this invention, the thickness of the copper can be preserved because the plating solution used is self-initiating. The electroless plating solution is formed of a platinum supply chemical and a reducing agent. It may also include one or more accelerators, one or more stabilizers, and one or more surfactants. The electroless plating solution is formed by mixing the components in deionized water, forming an aqueous solution.

The platinum supply chemical is chloroplatinic acid ($H_2PtCl_6$). The chloroplatinic acid is pretreated by tetramethylammonium hydroxide (TMAH) before it becomes part of the electroless plating solution. In the pretreatment, chloroplatinic acid is mixed with an amount of TMAH such that the concentration of TMAH exceeds the molar concentration of chlorine contained in $H_2PtCl_6$. The mixture is then heated to boiling for several hours, and then cooled down to form the mother solution for the platinum supply chemical having a pH in the approximate range of 13 to 14. The pre-treatment of chloroplatinic acid converts the acid into $H_2Pt(OH)_6^{2-}$. As a result of the pre-treatment, the electroless plating solution may not need a complexing agent because the system is self-complexed by the mixture of chloroplatinic acid and $H_2Pt(OH)_6^{2-}$. Not including a complexing agent may improve the deposition because a strong complexing agent can stop the deposition. Complexing agents that may be used include hydroxylamine and its derivatives, such as $NH_2OH$—HCl or $NH_2SO_4$, because they are stable in a temperature range of 20° C.-80° C. Ethylamine is another possible complexing agent in a bath having a temperature below 35° C. The amount of the platinum supply chemical is based on the concentration of the platinum required. For embodiments of this invention, platinum concentration is in the range of 2 mM to 50 mM and more particularly in the range of 3 mM and 20 mM. To obtain these concentrations the mother solution of the pre-treated platinum supply chemical is diluted with deionized water.

The reducing agent is hydrazine, in a concentration in the range of 0.01 to 2.0M, and more preferably in the range of 0.1 to 1M. The electroless plating solution may also include an accelerator. An accelerator serves to accelerate the plating speed or initiate the platinum electroless deposition. The accelerators are selected from derivatives of aliphatic sulfonic acid with a general formula of R—$SO_3H$, where R is a non-aromatic group such as an alkyl group, amino group, thiol group, amino-alkyl group, or thiol-alkyl group. Some examples are 3-mercapto-1-propane sulfonic acid (MPS), methanesulfonic acid, and sulfamic acid. The preferred concentration of the accelerator species is from 0 to 0.5M.

The electroless plating solution may also include one or more stabilizer additives to further stabilize the solution at bath operating temperatures. A primary and a secondary additive stabilizer may be used in an embodiment of this invention. In an embodiment, a primary and a secondary stabilizer are used. In this embodiment the primary stabilizer is 5-sulfosalicylic acid, that may have a concentration in the approximate range of 2 mM to 20 mM, and the secondary stabilizer is EDTA that may have a concentration in the approximate range of 1 mM to 10 mM. In an alternate embodiment hydroxyl amine is the stabilizer having a concentration in the approximate range of 5 mM to 50 mM. These stabilizers may also be used in combination with one another.

A surfactant may also be part of the formulation of the electroless plating solution. In one embodiment the surfactant is a non-ionic surfactant polyethylene glycol (PEG), or a random or block co-polymer of ethylene oxide and propylene oxide with different molecular weights in the range of 400-2000. One such example is polyethylene glycol (PEG) with a molecular weight in the range of 400 to 2500, and a concentration in the range of 2 ppm to 100 ppm. In another embodiment, the surfactant may be a compound used to form a surface modifier. These compounds are typically amphiphilic and can thus play the dual role of surfactant and molecular masking layer. Examples of amphiphilic surface modifier compounds include polyvinyl alcohol (PVA) and copolymers of PVA. The amphiphilic compound may form a molecular masking layer over the dielectric during the application of the electroless plating solution to the substrate. Therefore, by including a surface modifier in the electroless plating solution the number of steps in the process may be reduced while still enhancing the selectivity of the electroless plating solution to the copper film regions.

In one particular embodiment, the electroless plating solution to plate a platinum film over copper may be formed of the following components in deionized water. The platinum supply chemical is pre-treated chloroplatinic acid where the concentration of platinum in the plating bath is in the approximate range of 2 mM and 30 mM. The reducing agent is hydrazine in a concentration in the approximate range of 0.1M and 1M. This hydrazine concentration in combination with the complexing agent hydroxylamine and the stabilizer additives enables continuous, self-initiated, platinum deposition operation at bath termperatures of up to 80° C. without the need of intermittent hydrazine addition. The accelerator is sulfamic acid, also known as aminosulfonic acid, in a concentration in the approximate range of 0 to 0.5M. The primary stabilizer is 5-sulfosalicylic acid in a concentration in the approximate range of 2 mM to 20 mM, and the secondary stabilizer is EDTA having a concentration in the approximate range of 1 mM to 10 mM. In this embodiment, the electroless plating solution is applied to the regions of copper film at a temperature of 20-80° C. and at a pH in the approximate range of 8 and 12. The electroless plating solution is applied to the substrate by submerging the substrate in a bath of the solution for a time of approximately 0.5 and 2.0 minutes to form a copper layer having a thickness of 100 Å to 400 Å.

The electroless plating solution may be applied to the surface of the substrate 200 in any conventional manner to form the platinum film 250. Method of applying the electroless plating solution include, but are not limited to, substrate immersion into a plating bath tank, and bath solution dispensation onto the substrate from a dispensing nozzle or shower head connected with a bath reservoir and flow controller. In one embodiment the electroless plating solution is a bath and the substrate is submerged for a particular amount of time. The electroless plating bath solution may have a temperature in the range of 20° C. to 85° C. and a pH in the range of 8 to 12. The plating solution may be applied to the substrate for an amount of time in the range of approximately 30 seconds to 5 minutes, although this can vary depending on how thick of a platinum film is required. The amount of time that the substrate is exposed to the plating solution depends on the thickness desired for the platinum film being formed on the copper film. The choice of thickness of the platinum film depends on the particular application. For a capping layer application the thickness of the platinum film may be greater than 100 Å. For an electrode application for memory chips the thickness of the platinum film may be 50-200 Å. In one embodiment, the electroless plating solution is applied for a time in the approximate range of 30 seconds to 2 minutes. The platinum film may be a passivation layer over copper features in various semiconductor based devices in both memory and logic applications. For instance, the platinum film may be a capping layer over copper interconnects in a logic device, or the platinum film may be a passivation layer over a copper bottom electrode of a memory device.

A capping layer formed of platinum over copper interconnect lines, as illustrated in FIG. 2C, would serve as a passivation layer for the copper. Copper oxidizes very easily and must have a capping layer when it is very thin, less than 300 angstroms, or the oxidation would consume the entire thickness of the interconnect line. Platinum capping layers are highly conductive and would minimize any increase in resistance by a capping layer. Additionally, platinum itself does not oxidize and thus does not increase resistance of the interconnect lines due to oxidation and thus does not increase the effective dielectric constant of the interlayer dielectric layers formed over the platinum capping layers. A platinum capping layer over copper interconnects also prevents electromigration of the copper, therefore preventing shorting of the integrated circuit. The platinum film 250 formed over the copper interconnect lines 220 may have a thickness in a range of approximately 100 Å and 400 Å.

Figure 3A:
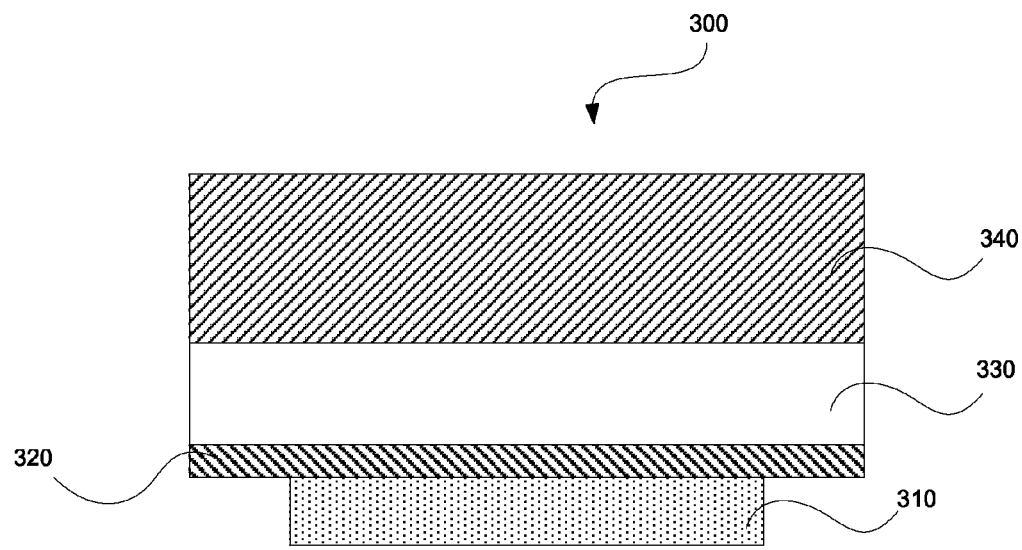
FIGS. 3A and 3B illustrate a cross-sectional view of a capacitor structure including a platinum film in accordance with embodiments of the current invention.
Figure 3B:
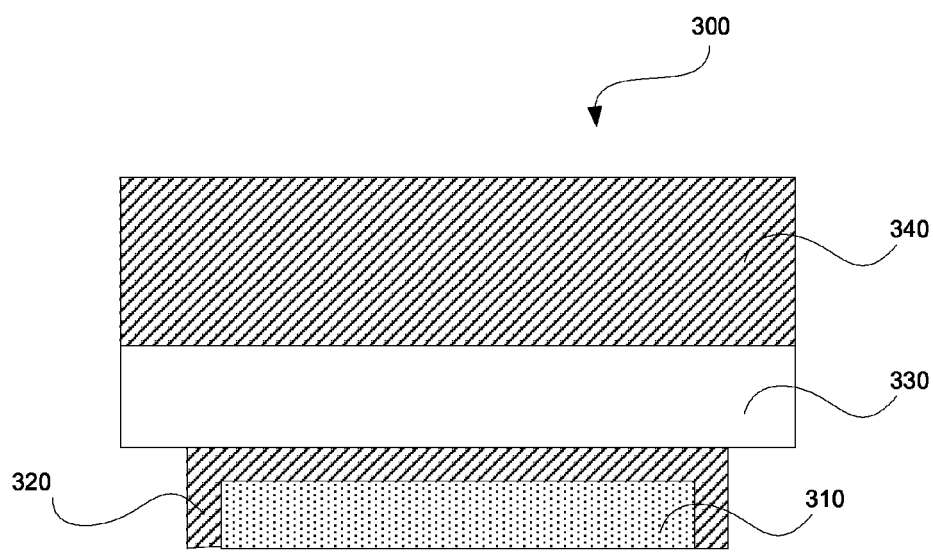

A self-initiated selectively formed platinum film is also valuable as a corrosion resistant layer atop a bottom copper electrode for certain memory devices. FIG. 3A illustrates an example capacitive device 300 having a metal-insulator-metal (MIM) structure. The MIM is formed of a copper bottom electrode 310, a platinum film 320, an insulator 330, and a top electrode 340. The platinum film 320 may serve as a barrier layer and a passivation layer on the copper bottom electrode 310. The platinum film 320 prevents the diffusion of copper into the insulator 330 of the MIM capacitor or into any surrounding insulating material such as an interlayer dielectric in an embodiment where the bottom electrode also doubles as the electrical wiring connection to the MIM. The platinum film 320 may also prevent the oxidation of the copper bottom electrode, which is an issue when the insulator 330 is an oxide. The platinum film 320 is selectively deposited using the self-initiated electroless deposition process described above. The use of a self-initiated and selective electroless deposition process simplifies the processing of the formation of the platinum film over the bottom copper electrode. The platinum passivation layer formed over the copper bottom electrode may have a thickness in the range of approximately 100 Å and 400 Å. As illustrated in FIG. 3A, the platinum film 320 can be formed conformally over the bottom electrode, wrapping around the sides of the copper bottom electrode 310. The ultrathin conformal layer formation by electroless deposition is desirable due to the selective and conformal nature of electroless deposition processes.

The electroless plating step may be followed by a rinse of deionized water. In one particular embodiment the rinse is performed with deionized water at room temperature for approximately 30 seconds. This rinse will remove excess plating solution from the substrate before further processing. In some embodiments, the rinse will not be enough to remove all of the plating solution and potential contaminates from the substrate before further processing. In this case a post-clean may be performed at block 105 of the flowchart of FIG. 1. The post-clean may be an acidic solution, such as hydrofluoric acid (0.3% by weight of the post-cleaning solution) in deionized water. The post-cleaning solution may be applied at room temperature for an approximate time of 1.0 minutes to 1.5 minutes. The surface modifier 230 may also be removed during the post-clean depending on the temperature and the post-cleaning solution. After the post-clean the substrate may be rinsed to remove the post-cleaning solution. In one embodiment, the rinse is with room temperature deionized water for approximately 0.5 minutes. The substrate may then be air dried before proceeding with subsequent processing.

Although the foregoing examples have been described in some detail for purposes of clarity of understanding, the invention is not limited to the details provided. There are many alternative ways of implementing the invention. The disclosed examples are illustrative and not restrictive.

What is claimed:

1. A capacitive device structure comprising:
   a bottom electrode portion;
   a dielectric portion,
      wherein the bottom electrode portion comprises copper and has a thickness of less than 300 angstroms;
   a surface modifier formed over the dielectric portion,
      wherein the bottom electrode portion is free from the surface modifier, and
      wherein the surface modifier comprises an amphiphilic compound;
   a noble metal layer formed over the bottom electrode portion, wherein the noble metal layer is a conformal layer wrapping over top and side surfaces of the bottom electrode portion,
   an insulator disposed over the noble metal layer, the insulator comprising an oxide,
      wherein the noble metal layer prevents oxygen of the insulator from diffusing to the bottom electrode portion; and
   a top electrode disposed over the insulator.

2. The structure of claim 1, wherein the noble metal layer comprises platinum.

3. The structure of claim 1, wherein the noble metal layer is a capping layer and the bottom electrode portion is an interconnect line of a semiconductor device.

4. The structure of claim 1, wherein the bottom electrode portion is a part of a memory device.

5. The structure of claim 1, wherein the noble metal layer is a passivation layer.

6. The structure of claim 1, wherein the dielectric is one of a silicon dioxide-based material ($SiO_2$), SiCN, SiCOH, SiN, SiC, $SiO_2$, methyl-silsesquioxane (MSQ), SiLK dielectric by Dow Chemical, parylene, or organic low-k polymers.

7. The structure of claim 6, wherein the dielectric portion further comprises a hard mask layer at the surface of the dielectric portion, the hard mask comprising a silicon-based material like $SiC_x$, $SiN_x$, or $SiC_xN_y$.

8. The structure of claim 1, wherein the surface modifier is a single monolayer.

9. The structure of claim 1, wherein the surface modifier is a self-assembled multilayered structure.

10. The structure of claim 1, wherein the surface modifier comprises one of polyvinyl alcohol (PVA), a PVA copolymer, an amphiphilic macromolecule, a modified starch compound, a protein compound, a diblock copolymer, a triblock copolymer, or a dendrimer.

11. The structure of claim 1, wherein the surface modifier comprises cross-linked molecules.

12. The structure of claim 1, wherein the dielectric portion comprises a porous low-k dielectric material.

13. The structure of claim 1, wherein the noble metal layer has a thickness of between 100 Angstroms and 400 Angstroms.

14. The structure of claim 1, wherein the noble metal layer has a thickness of between 50 Angstroms and 200 Angstroms.

15. The structure of claim 1, wherein the noble metal layer has a thickness of at least 100 Angstroms.

* * * * *